US008643267B2

(12) United States Patent
Matsuura et al.

(10) Patent No.: US 8,643,267 B2
(45) Date of Patent: Feb. 4, 2014

(54) ORGANIC ELECTROLUMINESCENCE DISPLAY DEVICE WITH UPPER ELECTRODE INCLUDING A THIN SILVER FILM

(75) Inventors: Toshiyuki Matsuura, Mobara (JP); Hirohito Yamaguchi, Kawasaki (JP); Masanori Yoshida, Chiba (JP); Nobutaka Mizuno, Tokyo (JP); Katsunori Oya, Chiba (JP)

(73) Assignees: Japan Display Inc., Tokyo (JP); Canon Kabushiki Kaisha, Tokyo (JP)

( * ) Notice: Subject to any disclaimer, the term of this patent is extended or adjusted under 35 U.S.C. 154(b) by 742 days.

(21) Appl. No.: 12/875,765

(22) Filed: Sep. 3, 2010

(65) Prior Publication Data
US 2011/0057920 A1 Mar. 10, 2011

(30) Foreign Application Priority Data

Sep. 4, 2009 (JP) ................................. 2009-204981
Aug. 9, 2010 (JP) ................................. 2010-178791

(51) Int. Cl.
*H01J 1/62* (2006.01)
(52) U.S. Cl.
USPC .......................................... 313/504; 313/498
(58) Field of Classification Search
USPC ............... 313/504, 506, 498, 512; 445/24, 25
See application file for complete search history.

(56) References Cited

U.S. PATENT DOCUMENTS

| 5,756,650 | A | * | 5/1998 | Kawamonzen et al. ...... 528/353 |
| 7,029,767 | B2 | | 4/2006 | Nakamata |
| 2004/0152392 | A1 | * | 8/2004 | Nakamura ...................... 445/25 |
| 2008/0290783 | A1 | * | 11/2008 | Tao et al. ....................... 313/498 |

FOREIGN PATENT DOCUMENTS

JP 2004-327414 11/2004

* cited by examiner

*Primary Examiner* — Joseph L Williams
(74) *Attorney, Agent, or Firm* — Antonelli, Terry, Stout & Kraus, LLP.

(57) ABSTRACT

In an organic electroluminescence display device which includes: a display region DR in which a plurality of pixels are arranged; and a power source part CC which is arranged outside the display region, each of the plurality of pixels includes: a lower electrode An; a light emitting layer stacked above the lower electrode; and an upper electrode which includes a thin silver film AG and is formed by a layer shared in common by other pixels above the light emitting layer, the upper electrode extends to the power source part for electrically connection, the thin silver film has a portion arranged between the display region and the power source part, and a background layer containing an electron pair donor is arranged as a background of at least a portion of the thin silver film between the display region and the power source part.

16 Claims, 8 Drawing Sheets

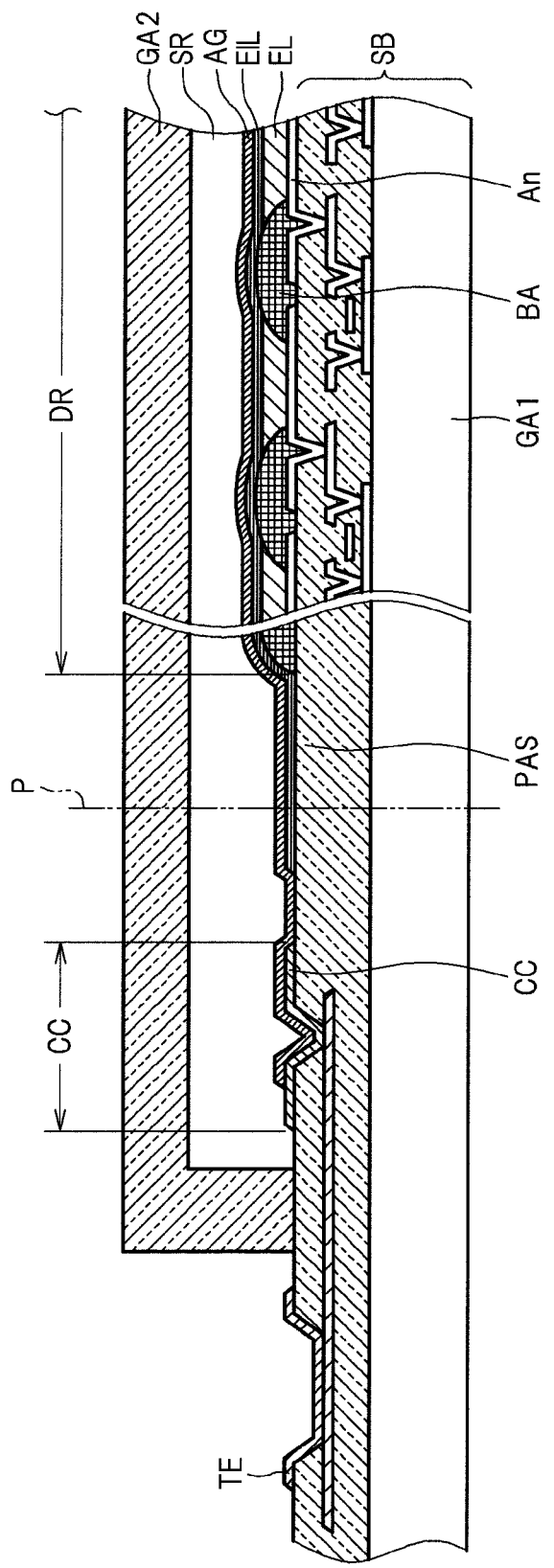

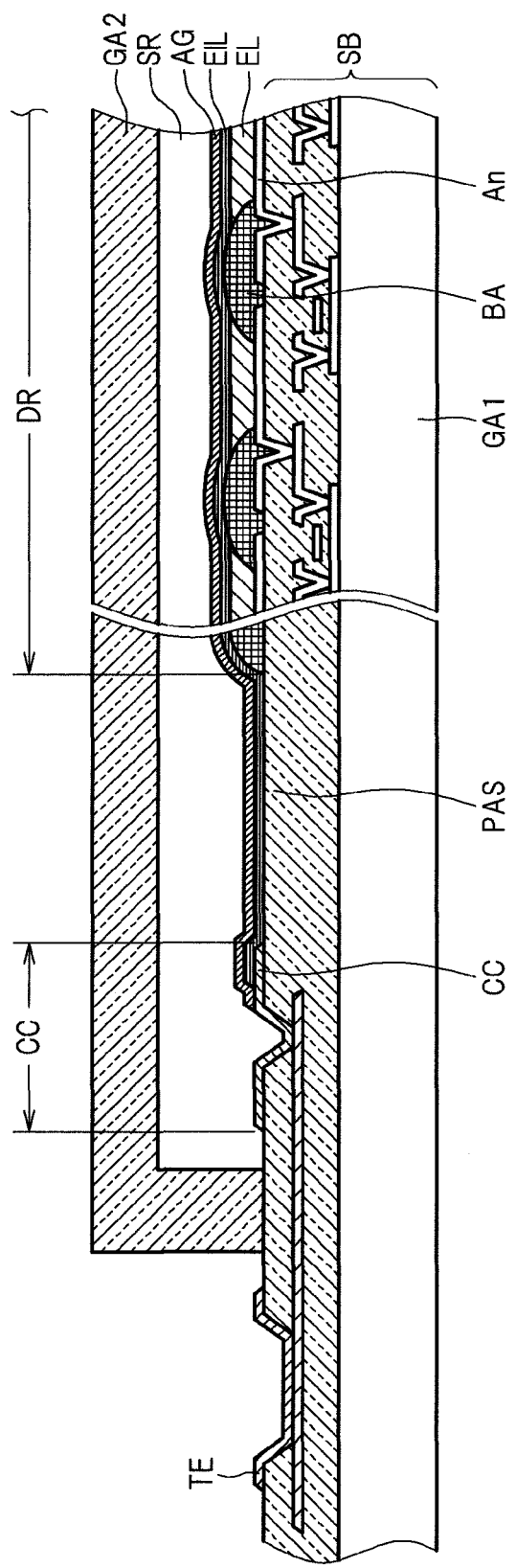

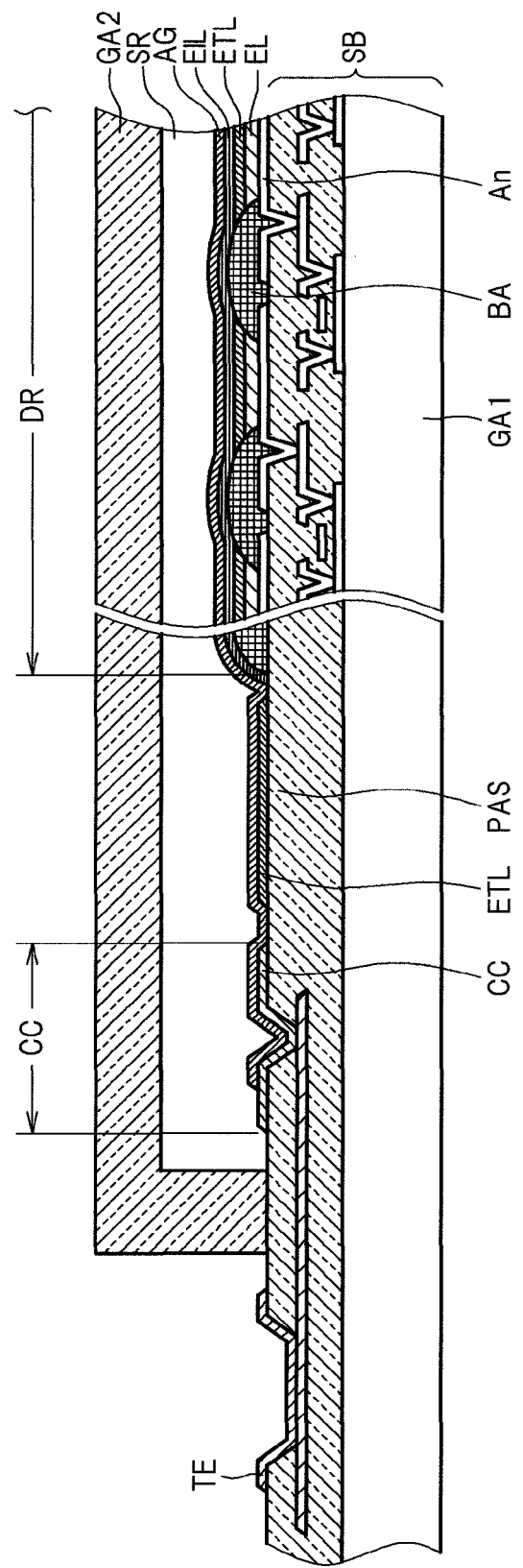

ORGANIC ELECTROLUMINESCENCE DISPLAY DEVICE WITH UPPER ELECTRODE INCLUDING A THIN SILVER FILM

CROSS-REFERENCE TO RELATED APPLICATIONS

The present application claims priority from Japanese applications JP 2009-204981 filed on Sep. 4, 2009, and JP 2010-178791 filed on Aug. 9, 2010, the contents of which are hereby incorporated by reference into this application.

BACKGROUND OF THE INVENTION

1. Field of the Invention

The present invention relates to a top-emission-type organic electroluminescence display device.

2. Description of the Related Art

In a top-emission-type organic electroluminescence display device which uses organic light emitting elements (OLED: Organic Light Emitting Diodes), there is a case where a silver layer stacked like a thin film is used for decreasing the electric resistance of an upper electrode which supplies a potential to a light emitting layer of each organic light emitting element. Although silver is a material which absorbs light little and possesses high reflectance, by stacking a thin-film-like silver layer above the light emitting layer, light can be taken out of a top side (upper side) of the organic electroluminescence display device while decreasing the electric resistance of the upper electrode.

JP 2004-327414 A discloses a technique where a buffer layer which includes a transparent material, metal or the like is provided between an organic electroluminescence layer and an upper electrode.

SUMMARY OF THE INVENTION

However, silver exhibits high aggregation property and hence, when a silver layer is formed into a thin film shape, there arises a case where the disconnection of an upper electrode occurs. On the other hand, for example, when a thickness of the silver layer is increased to make the occurrence of the disconnection difficult, a quantity of light which is taken out of a top side of the organic electroluminescence display device is decreased. Further, although the aggregation property of silver is suppressed by increasing the concentration of impurities in a silver layer with an addition of magnesium or the like, there arises the decrease of a transmission light quantity, the increase of the electric resistance or the like. Further, depending on a kind of impurity or an addition quantity of impurity, an optical characteristic or an electric characteristic changes sensitively thus making the manufacture of the organic electroluminescence display device difficult.

Further, the disconnection of the upper electrode attributed to the aggregability of silver occurs between a power source part and a display region in an organic electroluminescence display device in many cases.

The present invention has been made to overcome the above-mentioned drawbacks, and it is an object of the present invention to provide an organic electroluminescence display device which can decrease the electric resistance of an upper electrode while maintaining required light transmission quantity by using a thin silver film in forming the upper electrode, and can make the disconnection of the upper electrode scarcely occur between a power source part and a display region.

To overcome the above-mentioned drawbacks, according to a first aspect of the present invention, there is provided an organic electroluminescence display device which includes: a display region which is formed over a substrate and in which a plurality of pixels are arranged; and a power source part which is arranged in a spaced-apart manner from the display region and outside the display region and supplies a potential to the plurality of pixels, wherein each of the plurality of pixels includes: a lower electrode; a light emitting layer which is stacked above the lower electrode; and an upper electrode which includes a thin silver film and is formed by a layer shared in common by other pixels above the light emitting layer, the upper electrode extends toward the power source part from the display region and is electrically connected to the power source part, the thin silver film has a portion which is arranged between the display region and the power source part, and a background layer containing an electron pair donor is arranged as a background of at least a portion of the thin silver film between the display region and the power source part.

According to the organic electroluminescence display device of one aspect of the present invention, the plurality of pixels may further include an electron injection layer which is arranged between the light emitting layer and the upper electrode, and the background layer may be formed using the same material as the electron injection layer.

According to the organic electroluminescence display device of another aspect of the present invention, the plurality of pixels may further include an electron transport layer which is arranged between the light emitting layer and the upper electrode, and the background layer may be formed using the same material as the electron injection layer.

According to the organic electroluminescence display device of another aspect of the present invention, the organic electroluminescence display device may further include a protective layer for protecting the substrate, and the background layer may be formed by the protective layer which contains an electron pair donor.

According to the organic electroluminescence display device of another aspect of the present invention, the protective layer maybe formed using polyimide which contains pyrrolidinedione, and nitrogen atoms of pyrrolidinedione may have unshared electron pairs on a surface of the protective layer which is in contact with the thin silver film.

According to the organic electroluminescence display device of another aspect of the present invention, the protective layer may contain polyimide, and the background layer may be formed by applying ultraviolet treatment to the protective layer.

According to the organic electroluminescence display device of another aspect of the present invention, the electron injection layer may contain at least one of alkali metal and alkaline-earth metal.

According to the organic electroluminescence display device of another aspect of the present invention, the electron transport layer may contain at least one of alkali metal and alkaline-earth metal.

According to the organic electroluminescence display device of another aspect of the present invention, the background layer may supply electron pairs to silver atoms in the thin silver film.

According to the organic electroluminescence display device of another aspect of the present invention, the upper electrode may further include a transparent conductive film, and the transparent conductive film may be stacked on the thin silver film.

According to the organic electroluminescence display device of another aspect of the present invention, the transparent conductive film may extend toward the power source part from the display region and is brought into contact with the power source part.

According to the organic electroluminescence display device of another aspect of the present invention, the organic electroluminescence display device may further include a sealing film which covers the display region and the power source part, the sealing film may be arranged above the thin silver film, and the thin silver film may extend toward the power source part from the display region and is electrically connected to the power source part.

According to the organic electroluminescence display device of another aspect of the present invention, the thin silver film may extend toward the power source part from the display region and may be electrically connected to the power source part, and the background layer which is arranged as the background of at least the portion of the thin silver film may be formed so as to reach to the power source part from the display region.

To overcome the above-mentioned drawbacks, according to a second aspect of the present invention, there is provided an organic electroluminescence display device which includes: a display region which is formed over a substrate and in which a plurality of pixels are arranged; and a power source part which is arranged in a spaced-apart manner from the display region and outside the display region and supplies a potential to the plurality of pixels, wherein each of the plurality of pixels includes: a lower electrode; a light emitting layer which is formed over the lower electrode; an electron injection layer which is formed over the light emitting layer and contains at least one of alkali metal and alkaline-earth metal, and an upper electrode which is formed over the electron injection layer, wherein the electron injection layer and the upper electrode are respectively formed by a layer shared in common by the plurality of pixels, the upper electrode includes a thin silver film which is stacked on the electron injection layer and a transparent conductive film which is stacked on the thin silver film, the thin silver film and the electron injection layer respectively include a portion which extends toward the power source part from the display region, and the transparent conductive film is stacked so as to cover respective extending portions of the electron injection layer and the thin silver film whereby the transparent conductive film is electrically connected to the power source part.

According to the organic electroluminescence display device of one aspect of the present invention, the thin silver film may be a thin pure-silver film having purity of 99% or more.

According to the organic electroluminescence display device of another aspect of the present invention, the thin silver film and the electron injection layer may extend beyond an intermediate position between the power source part and the display region.

According to the present invention, it is possible to provide the organic electroluminescence display device which can decrease the electric resistance of the upper electrode while maintaining required light transmission quantity by using the thin silver film in forming the upper electrode, and can make the disconnection of the upper electrode scarcely occur between the power source part and the display region.

BRIEF DESCRIPTION OF THE DRAWINGS

FIG. 1A is a view showing a cross section of an organic electroluminescence display device according to a first embodiment;

FIG. 1B is a view showing a cross section of an organic electroluminescence display device according to a modification of the first embodiment;

FIG. 3 is a view showing a cross section of an organic electroluminescence display device according to a second embodiment;

DETAILED DESCRIPTION OF THE INVENTION

Figure 2A:
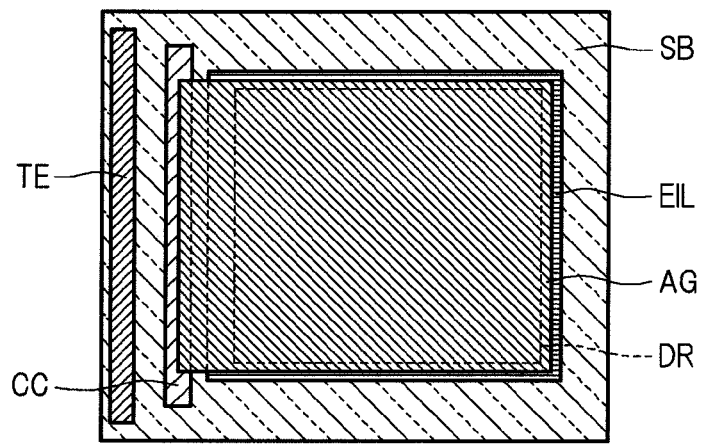
FIG. 2A is a schematic plan view of a TFT substrate according to the first embodiment.

Hereinafter, organic electroluminescence display devices according to respective embodiments of the present invention are explained in conjunction with drawings.

[First Embodiment]

An organic electroluminescence display device according to a first embodiment of the present invention is a top-emission type organic electroluminescence display device which is constituted of a TFT substrate which is formed by arranging organic electroluminescence elements on a glass substrate in a matrix array and a sealing substrate which is laminated to the TFT substrate and seals a region where the organic electroluminescence elements are arranged, wherein a display region on which an image is displayed is formed over a sealing substrate side.

On the TFT substrate, a large number of scanning signal lines are mounted at an equal interval from each other and, at the same time, a large number of video signal lines are mounted at an equal interval from each other in the direction perpendicular to the direction that the scanning signal lines are mounted. In each of pixel regions defined by these scanning signal lines and the video signal lines, a thin film transistor having the MIS (Metal-Insulator-Semiconductor) structure used for switching, a storage capacitance and an organic electroluminescence element are arranged. Further, an anode electrode and a cathode electrode are formed in such a manner that a light emitting layer in each pixel is sandwiched between the anode electrode and the cathode electrode. A potential difference is generated between these electrodes in accordance with signals supplied from the scanning signal line and the video signal line, and electrons or holes are supplied to the light emitting layer thus inducing the emission of light.

FIG. 1A shows a cross section of the organic electroluminescence display device according to the first embodiment. As shown in the drawing, the TFT substrate is constituted by forming the thin film transistors on a glass substrate GA1 in a matrix array, and organic films EL are patterned in a matrix array corresponding to the arrangement of the thin film transistors. Further, a transparent sealing substrate GA2 is laminated to the TFT substrate and, at the same time, a sealing film SR is filled in a space defined between the TFT substrate and the sealing substrate GA2 thus sealing the display region DR where the organic film EL is formed for every pixel. The organic films EL of the respective pixels are isolated from each other by a bank layer BA. The bank layer BA is a pixel separation film which is formed in a frame shape corresponding to partitioning of the pixels in the display region DR. The display region DR in this embodiment is, as shown in FIG. 1A, a region where the plurality of pixels are arranged, and is also a region of a range in which the bank layer BA is included. Each one of the pixels arranged in the display region DR includes a lower electrode An, the organic film EL including a light emitting layer, and an upper electrode having a thin silver film AG, wherein these members are formed in order of the lower electrode An, the organic film EL and an upper electrode from a substrate GA1 side.

In this embodiment, as shown in FIG. 1A, holes are supplied to the organic film EL of each pixel from the lower electrode An (anode electrode) which is connected to the thin film transistor on a TFT substrate SB. On the other hand, the upper electrode (cathode electrode) which is constituted of the thin silver film AG is formed over the organic film EL, and an electron injection layer EIL is formed below the upper electrode in an interposed manner between the upper electrode and the organic film EL thus supplying electrons to the organic film EL of each pixel. The electron injection layer EIL in this embodiment is formed including a layer which is shared in common by a plurality of pixels. The bank layer BA and the respective organic films EL in the display region DR are covered in common with the electron injection layer EIL. Further, in the same manner as the electron injection layer EIL, the thin silver film AG is formed of a layer which is shared in common by a plurality of pixels so that the upper electrodes of the respective pixels are continuously connected to each other.

In a region outside the display region DR, a power source part CC (cathode contact) which supplies a potential to a plurality of pixels is arranged in a spaced-apart manner from the display region DR. Here, to supply a potential to each pixel via the upper electrode, the upper electrode extends toward the power source part CC from the display region DR and is connected to the power source part CC electrically. Further, a fixed potential is supplied to the power source part CC from an external terminal TE provided outside the sealing substrate GA2. As shown in FIG. 1A, the power source part CC is electrically connected to the external terminal TE via a metal layer embedded in a protective layer PAS below a portion of the power source part CC on which the sealing substrate GA2 is mounted.

In this embodiment, the thin silver film AG has a portion which is arranged between the display region DR and the power source part CC, and the thin silver film AG extends to the power source part CC from the display region DR, goes over the power source part CC and is brought into contact with the power source part CC. Particularly, as shown in FIG. 1A, the electron injection layer EIL also extends toward the power source part CC from the display region DR in the same manner, and the electron injection layer EIL is arranged on at least a portion of a background of the thin silver film AG between the display region DR and the power source part CC.

Further, in this embodiment, the thin silver film AG which is used as the upper electrode has a thickness of 8 nm or more and 20 nm or less, preferably, 8 nm or more and 15 nm or less, and more preferably, 10 nm or more and 14 nm or less. The thin silver film AG having such a thickness functions as a half mirror so that light emitted from the organic film EL is taken out on a top side which is a sealing substrate GA2 side. The thin silver film AG may be formed with a thickness which ensures a quantity of light taken out on a top side. Further, when a composition rate of silver in the thin silver film AG is 80 percent by weight or more, the continuity of the film is lowered due to aggregation property of silver so that the disconnection of the thin silver film AG is liable to occur. When the purity of silver is further enhanced, the disconnection of the thin silver film AG or the like is more liable to occur.

The electron injection layer EIL according to this embodiment has a thickness of approximately 30 nm. The electron injection layer EIL has a function of receiving electron from the thin silver film AG which constitutes the upper electrode and a function of carrying the electrons to the organic film EL which includes the light emitting layer. Each one of the organic films EL separated by the bank layer BA is constituted of one-or-more-layered functional organic materials and, for example, the organic film EL includes a light emitting layer which contains a host material and a dopant material and emits light, a hole transport layer and a hole injection layer.

Particularly, an organic material having electron transportability which is contained in the electron injection layer EIL is an electron pair donor, and supplies electron pairs to silver atoms. The electron injection layer EIL extends toward the power source part CC from the display region DR, and is arranged as a background layer of the thin silver film AG. Accordingly, the background layer in this embodiment is formed of the same material as the electron injection layers EIL of the plurality of pixels in the display region DR. Here, the electron pair donor is a donor which includes unshared electron pairs (lone-pair electrons). It is considered that, due to chemical bonding between the unshared electron pairs of the electron pair donor which constitutes the background layer and silver atoms of the thin silver film AG, the silver atoms are formed in a diffused manner above the background layer so that the manifestation of aggregation property of the thin silver film is suppressed.

Further, as the organic material having electron transportability which is the electron pair donor and is contained in the electron injection layer EIL, for example, an oxadiazole derivative, an oxazole derivative, a thiazole derivative, a thiadiazole derivative, a pyridine derivative, a pyrazine derivative, a triazole derivative, a triazine derivative, a quinoline derivative, a quinoxaline derivative, a phenanthroline derivative and the like are named. However, the organic material is not limited to these materials.

Further, the electron injection layer EIL may not always contain the above-mentioned organic material having electron transportability. In this case, for example, the electron injection layer EIL contains alkali metal, alkaline-earth metal or a compound of these metals. By adding alkali metal or the like to the electron injection layer EIL, the organic material on a surface of the electron injection layer EIL constitutes the electron pair donor so that lone electron pairs are supplied to silver atoms thus suppressing the manifestation of aggregation property. Since the electron injection layer EIL is doped with a material which exhibits high electron density such as alkali metal, electrons are injected into the organic film EL through alkali metal or the like. Further, the electron injection layer EIL which contains the above-mentioned oxadiazole derivative or the like may further contain alkali metal or the like.

FIG. 2A is a schematic plan view of the glass substrate GA1 (TFT substrate SB) according to this embodiment on which the display region DR is formed. FIG. 2A shows a state where the sealing substrate GA2 of the organic electroluminescence display device is not adhered. As shown in the drawing, the electron injection layer EIL is stacked in such a manner that the electron injection layer EIL covers the whole area of the display region DR in which the organic films EL are formed in a matrix array. The thin silver film AG is stacked in such a manner that the thin silver film AG covers the whole area of the display region DR, extends toward the power source part CC from the display region DR, and is electrically connected to the power source part CC. Accordingly, the electron injection layer EIL is arranged on at least a portion of a background of the thin silver film AG between the display region DR and the power source part CC and hence, the aggregation of the thin silver film AG is suppressed.

By arranging the background layer made of the same material as the electron injection layer EIL on at least a portion of the thin silver film AG between the power source part CC and the display region DR, a contact area between the protective layer PAS formed using silicon nitride (SiN) or the like and the thin silver film AG is reduced thus suppressing the disconnection attributed to the aggregation of the thin silver film AG.

Also in this embodiment, it is desirable that the electron injection layer EIL extends to reach at least an intermediate point between the power source part CC and the display region DR. It is more preferable that the electron injection layer EIL extends toward the power source part CC from the display region DR not less than a length which is three quarters of a distance between the power source part CC and the display region DR. A line P in FIG. 1A and indicates the intermediate point between the power source part CC and the display region DR. As shown in FIG. 1A, the electron injection layer EIL in this embodiment extends exceeding the position which constitutes the line P, and is formed in a spaced-apart manner from the power source part CC.

A manufacturing method of the organic electroluminescence display device according to this embodiment is explained hereinafter.

Firstly, by repeating processing such as stacking and patterning of the colored conductive films made of aluminum or the like, the semiconductor films and the insulation films on the glass substrate GA1, the TFT substrate SB which includes the scanning signal lines, the video signal lines, the thin film transistors and the like is formed. The protective layer PAS is stacked on the TFT substrate SB using silicon nitride or the like for protecting these thin film transistors and the like and for leveling the TFT substrate. Next, in each pixel, the lower electrode An is formed using a material which possesses a high work function such as ITO and metal such as silver or aluminum having high reflectance as a reflective film. As shown in FIG. 1A, the lower electrode An is electrically connected to the thin film transistor, and a current and a voltage applied to the lower electrode An are controlled individually. After the formation of the lower electrode An, the bank layer BA is formed so as to define the respective pixel regions in a grid array. The organic film EL is formed by a mask vapor deposition method which uses a shadow mask in a region defined by the bank layer BA such that a functional organic material corresponding to light emitting color in each pixel is selectively formed over the lower electrode An.

Thereafter, on the organic film EL which is selectively formed in each pixel, the electron injection layers EIL are formed over the whole area of the display region DR such that the electron injection layers EIL have a film thickness in common among respective colors and are made of a material in common among respective colors, and the thin silver film AG is formed over the electron injection layers EIL by a vapor deposition method. The electron injection layers EIL are formed by vapor-depositing an organic material having electron transporting property. Further, when the electron injection layer EIL contains any one of alkali metal, alkaline-earth metal and a compound of these metals, the electron injection layers EIL are formed by simultaneously evaporating the organic material having electron transporting property and the alkali metal or the like. Then, by laminating the sealing substrate GA2 which is provided for dehumidifying the display region DR or the like to the TFT substrate SB together with the sealing film SR so that the organic film EL is protected from the outside air.

In this embodiment, the sealing film SR is filled between the sealing substrate GA2 and the TFT substrate SB and hence, the disconnection of the thin silver film AG is suppressed. Accordingly, this embodiment is more desirable than a case where a hollow space is formed between the sealing substrate GA2 and the TFT substrate SB. Further, even when the sealing substrate GA2 is not formed, for example, the disconnection of the thin silver film AG may be suppressed by forming the sealing film SR from above the thin silver film AG. The sealing film SR may be a resin film or an inorganic sealing film made of an inorganic material. Further, even when a hollow space is formed between the sealing substrate GA2 and the TFT substrate SB, for example, a transparent conductive film which covers the thin silver film AG may be formed as in the case of a fourth embodiment described later. In this embodiment, the upper electrode is formed of the thin silver film AG, the thin silver film AG extends from the display region DR and reaches the power source part CC, and the whole thin silver film AG is covered with the sealing film SR.

Figure 2B:
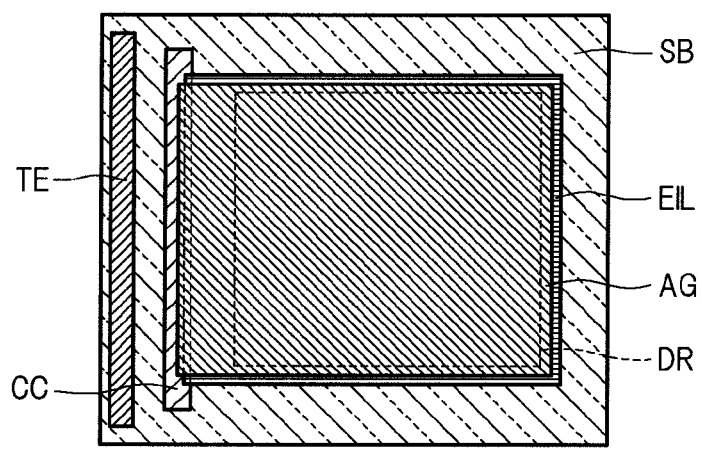
FIG. 2B is a schematic plan view of a TFT substrate according to the modification of the first embodiment.

Further, FIG. 1B shows a cross section of an organic electroluminescence display device according to a modification of this embodiment, and FIG. 2B is a schematic plan view of a glass substrate GA1 (TFT substrate SB) according to the modification of this embodiment. FIG. 2B shows a state where the sealing substrate GA2 is not adhered to the glass substrate GA1 in the organic electroluminescence display device.

The organic electroluminescence display device shown in FIG. 1B and FIG. 2B differs from the organic electroluminescence display device shown in FIG. 1A and FIG. 2A with respect to the point that the electron injection layer EIL extends to the power source part CC. Both organic electroluminescence display devices have the substantially same constitution except for the above-mentioned point. The whole portion of the thin silver film AG arranged between the display region DR and the power source part CC is formed over the background layer which has the electron pair donor so that the thin silver film AG is prevented from coming into contact with the protective layer PAS made of silicon nitride between the display region DR and the power source part CC. Accordingly, in the organic electroluminescence display device of this modification, compared to the organic electroluminescence display device shown in FIG. 1A and FIG. 2A, the aggregation or the like of the thin silver film AG scarcely occurs. However, when the electron injection layer EIL and the thin silver film AG are brought into contact with the power source part CC, a resistance value which the upper electrode has is liable to change due to an error in contact area which may occur during the manufacture.

In this manner, in the organic electroluminescence display device shown in FIG. 1B and FIG. 2B, the whole thin silver film AG arranged between the display region DR and the power source part CC is formed over the background layer.

Further, even when the background layer having electron pair donor is arranged on a background of only a portion of the thin silver film AG arranged between the display region DR and the power source part CC, it is desirable that the background layer is formed in such a manner that the background layer reaches to the power source part CC from the display region DR. By extending the background layer in this manner, a broken step is scarcely generated in the thin silver film AG arranged above the background layer and hence, a conductive state of the thin silver film AG which reaches to the power source part CC from the display region DR can be easily ensured.

[Second Embodiment]

Next, the second embodiment of the present invention is explained. FIG. 3 shows a cross section of an organic electroluminescence display device according to the second embodiment. In the second embodiment, in each of a plurality of pixels formed in a display region DR, an electron transport layer ETL is arranged between an organic film EL and a thin silver film AG, and the electron transport layer ETL is made of an organic material having electron transportability which includes an electron pair donor. Particularly, in the second embodiment, a background layer of the thin silver film AG formed between the display region DR and a power source part CC is formed using the same material as the electron transport layer ETL thus suppressing aggregation property of the thin silver film AG. The organic electroluminescence display device according to the second embodiment and the organic electroluminescence display device according to the first embodiment have substantially the same constitution except for the above-mentioned point.

In this embodiment, as the organic material which is contained in the electron transport layer ETL, in the same manner as the electron injection layer EIL in the first embodiment, an oxadiazole derivative, an oxazole derivative, a thiazole derivative, a thiadiazole derivative, a pyridine derivative, a pyrazine derivative, a triazole derivative, a triazine derivative, a quinoline derivative, a quinoxaline derivative, a phenanthroline derivative and the like are named. However, the organic material is not limited to these materials. Further, the electron transport layer ETL may contain alkali metal, alkaline-earth metal or a compound of these metals.

Further, as shown in FIG. 3, the electron injection layer EIL does not extend toward the power source part CC from the display region DR and is arranged up to the bank layer BA positioned on a boundary of the display region DR. Then, the background layer which is formed using the same material as the electron transport layer ETL is formed into an island shape in a spaced-apart manner from the power source part CC and the display region DR. However, the layer formed using the same material as the electron transport layer ETL may overlap with the bank layer BA positioned on the boundary of the display region DR or may overlap with the power source part CC.

Here, in the first embodiment, the electron injection layer EIL is stacked as the layer shared in common by the plurality of pixels in the display region DR. However, in the same manner as the electron transport layer ETL in the second embodiment, the electron injection layer EIL is formed for every pixel (or every group of pixels) and the background layer made of the same material as the electron injection layer EIL may be formed into an island shape. On the other hand, in the second embodiment, the electron transport layers ETL are individually arranged in the plurality of corresponding pixels in the display region DR. However, in the same manner as the electron injection layer EIL in the first embodiment, the electron transport layer ETL may be stacked as the layer shared in common by the plurality of pixels. Further, when the electron injection layer EIL and the electron transport layer ETL are formed by the layer shared in common by the plurality of pixels, in the same manner as the first embodiment, these layers may extend toward the power source part CC from the display region DR or, in the same manner as the second embodiment, these layers may be separated from the electron transport layer ETL formed in the display region DR and may be formed into an island shape between the display region DR and the power source part CC.

[Third Embodiment]

Figure 4:
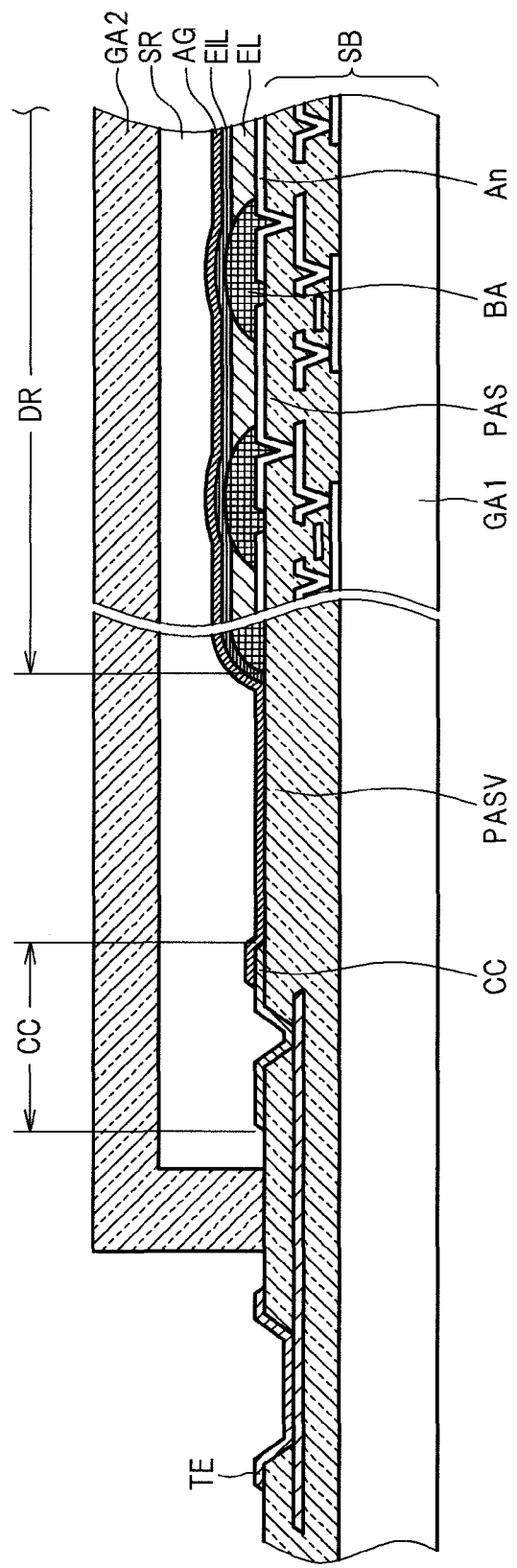
FIG. 4 is a view showing a cross section of an organic electroluminescence display device according to a third embodiment.

FIG. 4 shows a cross section of an organic electroluminescence display device according to the third embodiment. In the first embodiment and the second embodiment, a background layer made of the same material as the electron injection layer EIL or the electron transport layer ETL is formed over the background of at least the portion of the thin silver film AG between the display region DR and the power source part CC. The third embodiment differs from the first and second embodiments with respect to a point that a background layer of a thin silver film AG between a display region DR and a power source part CC is formed of a protective layer PASV having an electron pair donor.

To be more specific, the protective layer PASV is formed by forming a polyimide film and by applying ultraviolet treatment to the polyimide film. It is thought that polyimide becomes an electron pair donor due to such ultraviolet treatment so that the aggregation of the thin silver film AG is suppressed. The reason polyimide becomes an electron pair donor due to ultraviolet treatment is that polyimide includes pyrrolidinedione having a carbonyl group so that the carbonyl group is polarized by ultraviolet treatment thus generating unshared electron pairs in nitrogen atoms of pyrrolidinedione.

In this embodiment, the thin silver film AG extends toward the power source part CC from the display region DR and is electrically connected to the power source part CC. Then, between the display region DR and the power source part CC, on the background of the extending portion of the thin silver film AG, the protective layer PASV having the electron pair donor is arranged as the background layer. However, it goes without saying that, on the protective layer PASV, the background layer made of the same material as the electron injection layer EIL or the electron transport layer ETL may be arranged in the same manner as the arrangement in the first embodiment and the second embodiment.

[Fourth Embodiment]

Next, an organic electroluminescence display device according to a fourth embodiment of the present invention is explained.

Figure 5:
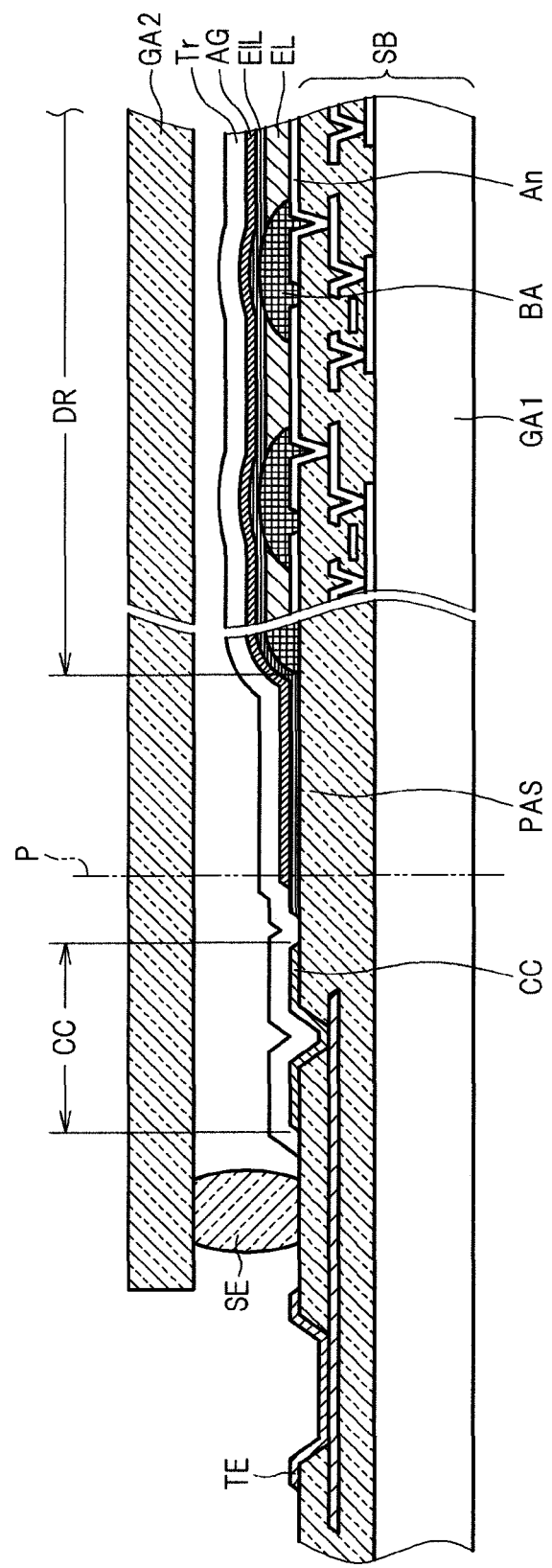
FIG. 5 is a view showing a cross section of an organic electroluminescence display device according to a fourth embodiment.

FIG. 5 shows a cross section of the organic electroluminescence display device according to the fourth embodiment. As shown in the drawing, the TFT substrate is constituted by forming thin film transistors on a glass substrate GA1 in a matrix array, and organic films EL are formed in a matrix array corresponding to the arrangement of the thin film transistors by coating. Further, a transparent sealing substrate GA2 is laminated to the TFT substrate by a sealing material SE thus sealing the display region DR where the organic films EL are formed in a matrix array. The organic films EL of the respective pixels are isolated from each other by a bank layer BA. The bank layer BA is a pixel separation film which is formed in a frame shape corresponding to partitioning of the pixels in the display region DR. The display region DR in this embodiment is, as shown in FIG. 5, a region where the plurality of pixels are arranged, and is also a region having a range in which the bank layer BA is included. Each one of the pixels arranged in the display region DR includes a lower electrode An, the organic film EL including a light emitting layer, and an upper electrode having a thin silver film AG, wherein these members are formed from a substrate GA1 side in order of the lower electrode An, the organic film EL and the upper electrode.

As shown in FIG. 5, to the organic film EL of each pixel, holes are supplied from the lower electrode An (anode electrode) connected to the thin film transistor on the TFT substrate. On the other hand, the upper electrode (cathode electrode) which is constituted of a transparent conductive layer Tr and the thin silver film AG is formed over an upper side of the organic film EL, and an electron injection layer EIL is interposed between a lower side of the upper electrode and the organic film EL thus supplying electrons to the organic film EL of each pixel. The electron injection layer EIL in this embodiment is formed by stacking one layer shared in common by a plurality of organic films EL patterned for respective pixels, and the bank layer BA and the respective organic films EL in the display region DR are covered in common with the electron injection layer EIL. The thin silver film AG and the transparent conductive layer Tr are, in the same manner as the electron injection layer EIL, formed by stacking the layer shared in common by the respective organic films EL in the display region DR.

In a region outside the display region DR, a power source part CC (cathode contact) which supplies a potential to a plurality of pixels is arranged in a spaced-apart manner from the display region DR. To be more specific, the upper electrode of each pixel extends toward the power source part CC from the display region DR and is connected to the power source part CC electrically. Further, a fixed potential is supplied to the power source part CC from an external terminal TE provided outside the sealing substrate GA2. As shown in FIG. 5, the power source part CC is electrically connected to the external terminal TE via a metal layer embedded in a protective layer PAS below a portion protective layer PAS on which the sealing material SE is provided. Further, between the power source part CC and the display region DR, the electron injection layer EIL and the thin silver film AG are stacked in an extending manner toward a power source part CC side, and the transparent conductive film Tr covers extending portions of the electron injection layer EIL and the thin silver film AG from above and reaches and comes into contact with the power source part CC. Further, the electron injection layer EIL is interposed between the protective layer PAS and the thin silver film AG formed over the TFT substrate thus stacking the thin silver film AG such that the thin silver film AG does not come into contact with the protective layer PAS.

Here, the transparent conductive film Tr is formed of a transparent conductive film made of indium tin oxide (ITO), indium oxide, indium zinc oxide (IZO (trademark)) or the like. Further, the thin silver film AG has smaller resistance than the transparent conductive film Tr. In this embodiment, from a viewpoint of the electric resistance and optical characteristics, the thin silver film AG is preferably formed of a thin pure-silver film having purity of 99% or more. When the thin silver film AG is formed of a thin pure-silver film, by setting a thickness of the thin silver film AG to 20 nm or less, preferably 15 nm or less, the thin silver film AG functions as a half mirror so that a quantity of light taken out from a top side is ensured. Further, when the thin silver film AG is formed of a thin pure-silver film, it is more preferable to set a thickness of the thin silver film to approximately 12 nm (10 nm or more and 14 nm or less), to be more specific. When the upper electrode is formed of only a thin pure-silver film, the continuity of the film deteriorates so that the supply of electricity to the display region DR becomes difficult. Accordingly, in this embodiment, besides the electron injection layer EIL described later, the transparent conductive film Tr is provided so as to cover the thin silver film AG from above for compensating for the thin silver film AG. The transparent conductive film Tr may have a thickness of approximately 100 nm. Here, although the upper electrode which is formed of only the transparent conductive film Tr made of IZO (trademark) exhibits the resistance of 80Ω/□, the upper electrode formed by using the thin pure-silver film together with IZO (trademark) can decrease a resistance value to 5Ω/□.

In this embodiment, the electron injection layer EIL is formed by adding any one of alkali metal, alkaline-earth metal or a compound of these metals to an organic material having electron transportability, and has a thickness of approximately 30 nm. The electron injection layer EIL has a function of receiving electrons from the thin silver film AG which constitutes the upper electrode and a function of carrying the electrons to the organic film EL which includes the light emitting layer. Each one of the organic films EL separated by the bank layer BA is constituted of one-or-more-layered functional organic materials and, for example, the organic film EL includes a light emitting layer which contains a host material and a dopant material and emits light, a hole transport layer and a hole injection layer. When the electron injection layer EIL is doped with a material such as alkali metal which exhibits high electron density, electrons are injected into the organic film EL through alkali metal or the like.

Here, the thin silver film AG has high surface energy, and aggregability of silver occurs when the difference in surface energy between the thin silver film AG and the background layer of the thin silver film AG is large. When the difference in surface energy is large, the thin silver film AG is aggregated into a mass at the time of manufacturing the organic electroluminescence display device or at the time of supplying electricity to the upper electrode. Further, there may be a case where the transparent conductive film Tr is broken due to such aggregation leading to the disconnection of the upper electrode. A surface of the electron injection layer EIL according to this embodiment is doped with alkali metal or the like which is a material having high electron density and exhibiting high surface energy. Accordingly, as described above, it is thought that the electron injection layer EIL which contains an electron pair donor due to doping of alkali metal or the like and silver atoms are chemically bonded. From another viewpoint, it is thought that surface energy of the electron injection layer EIL assumes a value near the surface energy of the thin silver film AG so that the manifestation of aggregation property of the thin silver film AG is suppressed.

Figure 6A:
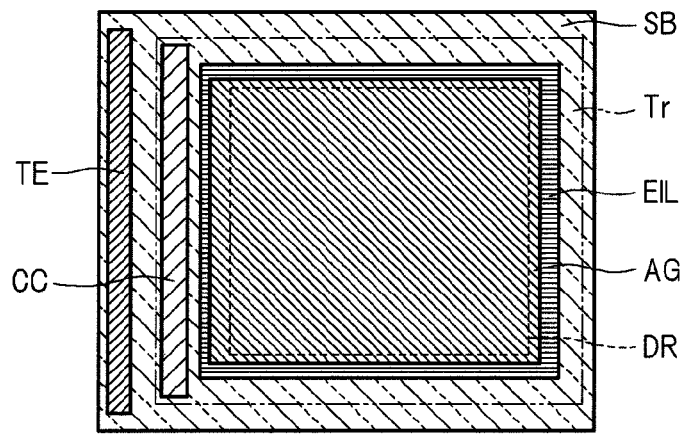
FIG. 6A is a schematic plan view of a TFT substrate according to the fourth embodiment.

FIG. 6A is a schematic plan view of a glass substrate GA1 (TFT substrate SB) according to this embodiment. FIG. 6A shows a state where the sealing substrate GA2 of the organic electroluminescence display device is not adhered. As shown in the drawing, the electron injection layer EIL is stacked in such a manner that the electron injection layer EIL covers the whole area of the display region DR in which the organic films EL are formed in a matrix array. The thin silver film AG is stacked so as to cover the whole area of the display region DR in a region inside the electron injection layer EIL as viewed in a plan view. Accordingly, a background layer in the whole area of the thin silver film AG is constituted of the electron injection layer EIL and hence, the aggregation of the thin silver film AG is suppressed. Between the power source part CC and the display region DR, the resistance of the upper electrode can be decreased by reaching the thin silver film AG to the power source part CC side from the display region DR, while the background layer of the thin silver film AG is constituted of the electron injection layer EIL and hence, a contact between the protective layer PAS formed using silicon nitride (SiN) and the like and the thin silver film AG can be avoided whereby the disconnection attributed to the aggregation of the thin silver film AG can be suppressed. Further, in this embodiment, as shown in FIG. 6A, the transparent conductive film Tr covers the thin silver film AG, the electron injection layer EIL and the whole area of the power source part CC and is connected to the power source part CC. However, the transparent conductive film Tr may be brought into partial contact with the power source part CC. Since the transparent conductive film Tr covers portions of the thin silver film AG and the electron injection layer EIL extending toward the power source part CC and reaches the power source part CC, electricity is supplied to the respective organic films EL in the display region DR.

It is desirable that the respective extending portions of the electron injection layer EIL and the thin silver film AG which respectively extend toward a power source part CC side from the display region DR reach at least an intermediate point of the power source part CC and the display region DR. It is more preferable that the electron injection layer EIL extends toward the power source part CC side from the display region DR by a distance which is three quarters of a distance between the power source part CC and the display region DR, and the thin silver film AG extends by a distance which is one half of the distance. The line P in FIG. 5 indicates a position away from the display region DR by the distance which is three quarters of the distance between the power source part CC and the display region DR. As shown in FIG. 5, the electron injection layer EIL and the thin silver film AG in this embodiment extend beyond the position of the line P between the power source part CC and the display region DR, and the electron injection layer EIL and the silver film AG are formed in a spaced apart manner from the power source part CC. When these parts are brought into contact with the power source part CC, a resistance value which the upper electrode possesses is liable to change due to an error of a contact area which occurs during the manufacture of the organic electroluminescence display device and hence, in this embodiment, the electron injection layer EIL and the thin silver film AG are formed in a spaced-apart manner from the power source part CC.

The transparent conductive film Tr is formed by a sputtering method using IZO (trademark) as a material in a region ranging from above the electron injection layer EIL and the thin silver film AG to the power source part CC. Outside a region where the transparent conductive film Tr is formed, the sealing substrate GA2 for dehumidifying the display region DR, for example, is adhered to the TFT substrate using a sealing material SE so that a space defined between the sealing substrate GA2 and the TFT substrate is brought into a hollow sealing state whereby the organic films EL are protected from the outside air. The manufacturing method of this embodiment is substantially equal to the manufacturing method of the first embodiment except for such a point.

Figure 6B:
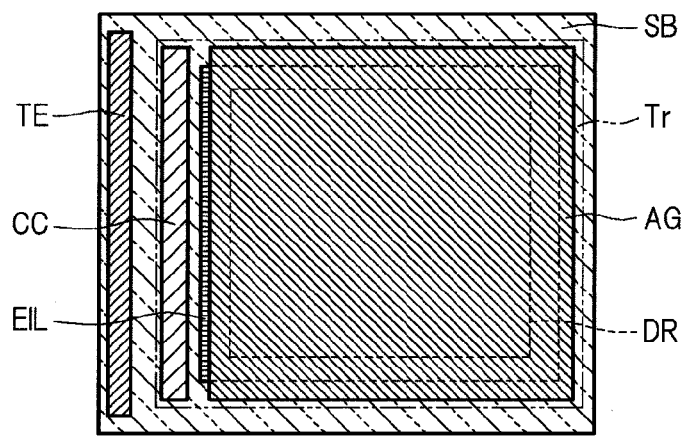
FIG. 6B is a view showing a first modification of the organic electroluminescence display device according to the fourth embodiment.

FIG. 6B shows a first modification of the organic electroluminescence display device according to this embodiment, and is a plan view of the glass substrate GA1 (TFT substrate). As shown in the drawing, an electron injection layer EIL and a thin silver film AG are stacked so as to cover the whole area of a display region DR. Here, between a power source part CC and the display region DR, the electron injection layer EIL extends more toward a power source part CC side than the thin silver film AG extends so that the electron injection layer EIL forms a background of the thin silver film AG. On the other hand, in three other directions where the power source part CC is not present, the thin silver film AG extends in a projecting manner from the electron injection layer EIL, and a background of the thin silver film AG in such portions is constituted of a protective layer PAS of the TFT substrate. A portion of the thin silver film AG which projects from the electron injection layer EIL is liable to cause the aggregation of silver. However, even when the aggregation occurs in such a portion and the transparent conductive film Tr is disconnected, the thin silver film AG maintains a function of an upper electrode which supplies electricity to the respective organic films EL in the display region DR from the power source part CC. In this manner, by arranging the thin silver film AG such that the thin silver film AG is arranged outside the display region DR but does not fall within the electron injection layer EIL in any one of the directions where the power source part CC is not present, the demand for alignment accuracy can be alleviated.

Figure 6C:
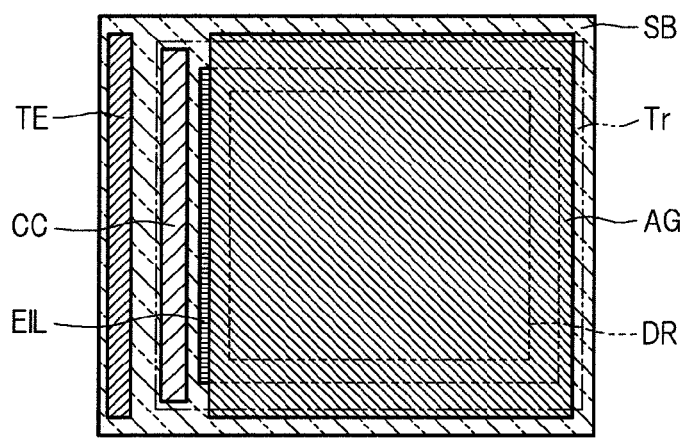
FIG. 6C is a view showing a second modification of the organic electroluminescence display device according to the fourth embodiment.

FIG. 6C shows a second modification of the organic electroluminescence display device according to this embodiment, and is a plan view of the glass substrate GA1 (TFT substrate). As shown in the drawing, an electron injection layer EIL and a thin silver film AG are stacked so as to cover the whole area of a display region DR. Between a power source part CC and the display region DR, the electron injection layer EIL extends more toward a power source part CC side than the thin silver film AG extends so that the electron injection layer EIL forms a background of the thin silver film AG. On the other hand, in three other directions where the power source part CC is not present, the thin silver film AG extends in a projecting manner from the electron injection layer EIL, and a background of the thin silver film AG in such portions is constituted of a protective layer PAS of the TFT substrate. A portion of the thin silver film AG which projects from the electron injection layer EIL is liable to cause the aggregation of silver. However, even when the aggregation occurs in such a portion and the transparent conductive film Tr is disconnected, the thin silver film AG maintains a function of an upper electrode which supplies electricity to the respective organic films EL in the display region DR from the power source part CC. In this manner, in the formation of the thin silver film AG, by arranging the thin silver film AG such that the thin silver film AG is arranged outside the display region DR but does not fall within the electron injection layer EIL or the transparent conductive film Tr in any one of the directions where the power source part CC is not present, the demand for alignment accuracy can be alleviated.

Although the protective layer PAS is formed using silicon nitride in this embodiment, the protective layer PAS may be formed of a film made of polyimide, an acrylic resin or a light transmitting silicon compound such as silicon dioxide ($SiO_2$). Also in these cases, by arranging the same material as the electron injection layer EIL which contains an electron pair donor as a background layer of the thin silver film AG between the power source part CC and the display region DR, the aggregation property can be suppressed. Although the fourth embodiment has been explained heretofore, the fourth embodiment mainly differs from the first embodiment with respect to a point that the thin silver film AG is covered with the transparent conductive film Tr. However, the fourth embodiment is substantially equal to the first embodiment except for the point explained above.

[Fifth Embodiment]

Figure 7:
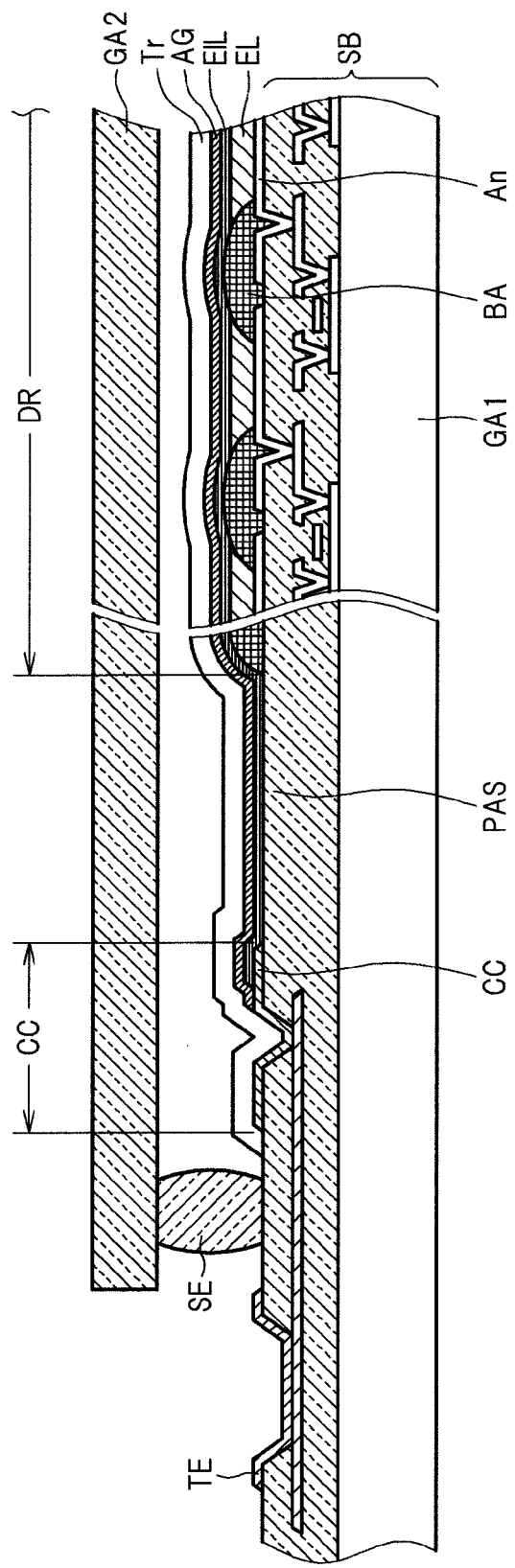
FIG. 7 is a view showing a cross section of an organic electroluminescence display device according to a fifth embodiment.

FIG. 7 shows a cross section of an organic electroluminescence display device according to a fifth embodiment. In the fourth embodiment, the power source part CC is arranged parting from the electron injection layer EIL and the thin silver film AG. The electron injection layer EIL and the thin silver film AG are stacked without overlapping with the power source part CC. On the other hand, the fifth embodiment differs from the fourth embodiment with respect to points that the power source part CC and the electron injection layer EIL overlap with each other such that the electron injection layer EIL goes over a portion of the power source part CC, the thin silver film AG extends more than the electron injection layer EIL, goes over the portion where the electron injection layer EIL and the power source part CC overlap with each other, and overlaps with the power source part CC. The fifth embodiment is substantially equal to the fourth embodiment except for the above-mentioned points, and the explanation of the points of the fifth embodiment which are substantially equal to the corresponding points of the fourth embodiment is omitted.

Both the thin silver film AG and the transparent conductive film Tr have conductivity, wherein the thin silver film AG exhibits the lower electric resistance than the transparent conductive film Tr. Although the electron injection layer EIL hardly has conductivity, by extending the electron injection layer EIL such that the electron injection layer EIL reaches the power source part CC, it is possible to more reliably prevent the thin silver film AG from coming into contact with the protective layer PAS between the display region DR and the power source part CC. The power source part CC is formed using metal such as aluminum, for example, and has surface energy near surface energy of the thin silver film AG. Accordingly, even when the thin silver film AG extends more than the electron injection layer EIL and is brought into contact with the power source part CC, power consumption can be reduced while making the occurrence of aggregation of the thin silver film AG difficult.

Also in the above-mentioned first to third embodiments, it is preferable that the thin silver film AG is formed of a thin pure-silver film having purity of 99% or more in the same manner as the fourth and fifth embodiments.

In the above-mentioned first to fifth embodiments, the power source part CC is provided along one side of the display region DR at one place outside the display region DR. However, for example, the power source part CC may be provided at a plurality of places in a distributed manner or may be provided along a plurality of sides. Also in either case, between the display region DR and the power source part CC, the thin silver film AG extends toward the power source part CC from the display region DR, and a background layer which is arranged in at least a portion of a background of an extending portion of the thin silver film AG includes an electron pair donor so that the aggregation of silver can be suppressed.

The organic electroluminescence display devices according to the respective embodiments of the present invention explained heretofore are not limited to the above-mentioned respective embodiments, and the organic electroluminescence display device may be carried out in different modes without departing from the technical concept of the present invention.

EXAMPLE 1

An example 1 of an organic electroluminescence display device according to the present invention is explained hereinafter in conjunction with drawings.

As shown in FIG. 4, the thin film transistors are formed over the glass substrate GA1, and the thin film transistors are covered with the protective layer PAS thus forming the TFT substrate SB. On the protective layer PAS, anode contact holes which electrically connect the thin film transistors and the lower electrodes An which are formed later, and the power source part CC which is arranged outside in a spaced-apart manner from the display region DR and supplies a potential to the upper electrode (the thin silver film AG) formed later are formed. As a material for forming the protective layer PAS, a polyimide resin is used.

Next, the lower electrodes An are formed over the protective layer PAS. The lower electrode An has the two-layered structure where the film made of IZO (trademark) is stacked on the reflection layer made of silver. The lower electrodes An are formed such that a film is formed by a sputtering method and the film is patterned by photolithography patterning. The lower electrode An is electrically connected to the thin film transistor of the TFT substrate SB via the anode contact hole.

Next, the bank layer BA is formed such that the bank layer BA covers peripheries of edge portions of the lower electrodes An and the power source part CC is exposed. A polyimide resin is used as a material for forming the bank layer BA. The bank layer BA is formed by coating a polyimide resin by spin coating and applying photolithograph patterning to the coated polyimide resin.

Next, the TFT substrate SB which is formed in the above-mentioned manner is conveyed to a chamber in dry air atmosphere, and ultraviolet treatment (UV treatment) is applied to the TFT substrate SB. By applying ultraviolet treatment to the TFT substrate SB, hole injection property of the lower electrodes An can be increased. Further, a carbonyl group which the polyimide resin contains is polarized thus generating an electron pair donor and hence, a protective layer PASV having an electron pair donor can be formed.

Next, the TFT substrate SB to which the above-mentioned treatment is applied is conveyed to a vacuum film forming chamber, where the respective organic electroluminescence elements are formed. In this embodiment, the organic film EL of each organic electroluminescence element is constituted of a hole transport layer, a light emitting layer which emits light of each color and an electron transport layer. Further, each organic electroluminescence element includes the electron injection layer EIL.

As a material for forming the hole transport layer, N,N'-α-di-naphthyl benzidine (α-NPD) is used. As a material of the light emitting layer which emits red light, Ir complex (18 percent by weight) and 4,4'-N,N'-di-carbazole-biphenyl (CBP) are used. As a material of the light emitting layer which emits green light, coumarin pigment (1.0 percent by weight) and tris [8-hydroxyquinolinate]aluminum (Alq3) are used. As a material of the light emitting layer which emits blue light, perylene pigment (1.0 percent by weight) and tris[8-hydroxyquinolinate] aluminum (Alq3) are used.

Bathophenanthroline (Bphen) is used as a material for forming the electron transport layer. Bphen is used as a host material for forming the electron injection layer EIL and $Cs_2CO_3$ is used as a dopant of Bphen.

Bphen is an organic material having electron transportability and contains an electron pair donor.

The organic film EL and the electron injection layer EIL are formed such that a film is formed by a vacuum deposition method and the formed film is patterned on the TFT substrate SB using a shadow mask.

With respect to a film thickness of each hole transport layer in each organic electroluminescence element, the hole transport layer in the organic electroluminescence element which emits red light has a thickness of 180 nm, the hole transport layer in the organic electroluminescence element which emits green light has a thickness of 120 nm, and the hole transport layer in the organic electroluminescence element which emits blue light has a thickness of 80 nm. With respect to a film thickness of the light emitting layer in each organic electroluminescence element, the light emitting layer in the organic electroluminescence element which emits red light has a thickness of 30 nm, the light emitting layer in the organic electroluminescence element which emits green light has a thickness of 40 nm, and the light emitting layer in the organic electroluminescence element which emits blue light has a thickness of 20 nm. Film thicknesses of the electron transport layer and the electron injection layer EIL are common values among the respective organic electroluminescence elements, that is, 20 nm and 30 nm.

Here, the electron injection layer EIL is formed such that the electron injection layer EIL extends toward the power source part CC from the display region DR and covers a portion of the protective layer PASV.

Next, the upper electrode (thin silver film AG) which contains silver is formed on the electron injection layer EIL by vapor deposition. A film thickness of the thin silver film AG is 10 nm and a composition ratio of silver is 90 percent by weight. A region where the thin silver film AG is formed is set such that the thin silver film AG covers the whole display region DR and the power source part CC. That is, the electron injection layer EIL which contains Bhen is arranged as a background of the thin silver film AG in the display region DR, and a layer which contains polyimide and to which ultraviolet treatment is applied is arranged as a background of a portion of the thin silver film AG extending toward the power source part CC from the display region DR.

Then, the structural body is conveyed to a CVD film forming device without breaking a vacuum and a silicon nitride film having a thickness of 6 μm is formed as a sealing film SR.

In this embodiment, the thin silver film AG is in contact with the layer which contains an electron pair donor and hence, the aggregation property of the thin silver film AG is suppressed so that the increase of the resistance of the thin silver film AG can be prevented whereby it is possible to provide the organic electroluminescence display device which can acquire the favorable light emission.

COMPARISON EXAMPLE

An organic electroluminescence display device shown in FIG. 1A is manufactured by a technique substantially equal to the technique of the example 1 except for a point that p-sexiphenyl is used as a host material of the electron injection layer EIL and ultraviolet treatment is not applied to the protective layer PAS. Such an organic electroluminescence display device cannot acquire light emission or brightness gradient occurs in the inside of the display region along with the increase of resistance of the upper electrode. When the SEM observation is performed with respect to portions of the thin silver film AG which use the electron injection layer EIL or the protective layer PAS to which the ultraviolet treatment is not applied as the background, the aggregation of the thin silver film AG is observed. It is thought that p-sexiphenyl does not contain an electron pair donor and hence, the aggregation of the thin silver film AG occurs.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic electroluminescence display device comprising:
   a display region which is formed over a substrate and in which a plurality of pixels are arranged; and
   a power source part which is arranged in a spaced-apart manner from the display region and outside the display region and supplies a potential to the plurality of pixels, wherein
   each of the plurality of pixels includes:
   a lower electrode;
   a light emitting layer which is stacked above the lower electrode; and
   an upper electrode which includes a thin silver film and is formed by a layer shared in common by other pixels above the light emitting layer,
   the upper electrode extends toward the power source part from the display region and is electrically connected to the power source part,
   the thin silver film has a portion which is arranged between the display region and the power source part, and
   a background layer containing an electron pair donor is arranged as a background of at least a portion of the thin silver film between the display region and the power source part.

2. The organic electroluminescence display device according to claim 1, wherein the plurality of pixels further include an electron injection layer which is arranged between the light emitting layer and the upper electrode, and the background layer is formed using the same material as the electron injection layer.

3. The organic electroluminescence display device according to claim 1, wherein the plurality of pixels further include an electron transport layer which is arranged between the light emitting layer and the upper electrode, and
   the background layer is formed using the same material as the electron transport layer.

4. The organic electroluminescence display device according to claim 1, wherein the organic electroluminescence display device further includes a protective layer for protecting the substrate, and
   the background layer is formed by the protective layer which contains an electron pair donor.

5. The organic electroluminescence display device according to claim 4, wherein the protective layer is formed using polyimide which contains pyrrolidinedione, and
   nitrogen atoms of pyrrolidinedione have unshared electron pairs on a surface of the protective layer which is in contact with the thin silver film.

6. The organic electroluminescence display device according to claim 4, wherein the protective layer contains polyimide, and
   the background layer is formed by applying ultraviolet treatment to the protective layer.

7. The organic electroluminescence display device according to claim 2, wherein the electron injection layer contains at least one of alkali metal and alkaline-earth metal.

8. The organic electroluminescence display device according to claim 3, wherein the electron transport layer contains at least one of alkali metal and alkaline-earth metal.

9. The organic electroluminescence display device according to claim 1, wherein the background layer supplies electron pairs to silver atoms in the thin silver film.

10. The organic electroluminescence display device according to claim 1, wherein the upper electrode further includes a transparent conductive film, and
the transparent conductive film is stacked on the thin silver film.

11. The organic electroluminescence display device according to claim 10, wherein the transparent conductive film extends toward the power source part from the display region and is brought into contact with the power source part.

12. The organic electroluminescence display device according to claim 1, wherein the organic electroluminescence display device further includes a sealing film which covers the display region and the power source part,
the sealing film is arranged above the thin silver film, and
the thin silver film extends toward the power source part from the display region and is electrically connected to the power source part.

13. The organic electroluminescence display device according to claim 1, wherein the thin silver film extends toward the power source part from the display region and is electrically connected to the power source part, and
the background layer which is arranged as the background of at least the portion of the thin silver film is formed so as to reach to the power source part from the display region.

14. An organic electroluminescence display device comprising:
a display region which is formed over a substrate and in which a plurality of pixels are arranged; and
a power source part which is arranged in a spaced-apart manner from the display region and outside the display region and supplies a potential to the plurality of pixels, wherein
each of the plurality of pixels includes:
a lower electrode;
a light emitting layer which is formed over the lower electrode;
an electron injection layer which is formed over the light emitting layer and contains at least one of alkali metal and alkaline-earth metal, and
an upper electrode which is formed over the electron injection layer, wherein
the electron injection layer and the upper electrode are respectively formed by a layer shared in common by the plurality of pixels,
the upper electrode includes a thin silver film which is stacked on the electron injection layer and a transparent conductive film which is stacked on the thin silver film,
the thin silver film and the electron injection layer respectively include a portion which extends toward the power source part from the display region, and
the transparent conductive film is stacked so as to cover respective extending portions of the electron injection layer and the thin silver film whereby the transparent conductive film is electrically connected to the power source part.

15. The organic electroluminescence display device according to claim 14, wherein the thin silver film is a thin pure-silver film having purity of 99% or more.

16. The organic electroluminescence display device according to claim 14, wherein the thin silver film and the electron injection layer extend beyond an intermediate position between the power source part and the display region.

* * * * *